United States Patent
Hongo et al.

(10) Patent No.: US 7,180,387 B2
(45) Date of Patent: Feb. 20, 2007

(54) ANTENNA DUPLEXER

(75) Inventors: Masanori Hongo, Osaka (JP); Natsuyo Nagano, Osaka (JP); Takashi Ogura, Kyoto (JP); Hideki Ito, Osaka (JP); Toshio Tanuma, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 177 days.

(21) Appl. No.: 10/992,644

(22) Filed: Nov. 22, 2004

(65) Prior Publication Data

US 2005/0116790 A1 Jun. 2, 2005

(30) Foreign Application Priority Data

Nov. 27, 2003 (JP) .............................. 2003-397971

(51) Int. Cl.
*H01P 1/213* (2006.01)
*H03H 9/72* (2006.01)

(52) U.S. Cl. .................. 333/132; 333/133; 333/129

(58) Field of Classification Search ................ 333/133, 333/126, 129, 132, 134
See application file for complete search history.

(56) References Cited

U.S. PATENT DOCUMENTS

| | | | | |
|---|---|---|---|---|
| 6,351,194 | B2* | 2/2002 | Takahashi et al. | 333/133 |
| 6,781,479 | B2* | 8/2004 | Ikada et al. | 333/133 |
| 6,919,778 | B2* | 7/2005 | Iwamoto et al. | 333/133 |
| 2002/0109561 | A1* | 8/2002 | Iwamoto et al. | 333/133 |
| 2005/0206477 | A1* | 9/2005 | Cheema et al. | 333/133 |

FOREIGN PATENT DOCUMENTS

| | | | | |
|---|---|---|---|---|
| JP | 6-97761 | * | 4/1994 | 333/32 |
| JP | 11-340781 | | 12/1999 | |
| JP | 2000-307383 | | 11/2000 | |
| JP | 2003-298462 | * | 10/2003 | |

* cited by examiner

*Primary Examiner*—Barbara Summons
(74) *Attorney, Agent, or Firm*—Armstrong, Kratz, Quintos, Hanson & Brook, LLP

(57) ABSTRACT

The present invention provides an antenna duplexer comprising a package having a plurality of ceramic layers superposed, and a transmitting filter and a receiving filter which are mounted on a surface of the package. A phase-matching strip line is formed on a surface of one ceramic layer. The package has grounding layers formed respectively on surfaces of upper and lower ceramic layers with the phase-matching strip line interposed therebetween. A plurality of via holes are formed around the phase-matching strip line for connecting the two grounding layers to each other.

4 Claims, 5 Drawing Sheets

ANTENNA DUPLEXER

BACKGROUND OF THE INVENTION

1. Field of the Invention

The present invention relates to antenna duplexers mounted on portable telephones, etc.

2. Description of Related Art

As shown in FIG. 5, an antenna duplexer 80 comprises an antenna terminal ANT to be connected to an antenna, a transmitting signal terminal Tx to be connected to a transmitting circuit, and a receiving signal terminal Rx to be connected to a receiving circuit. The antenna terminal ANT is connected to the transmitting signal terminal Tx and the receiving signal terminal Rx via a branchpoint 10. A transmitting filter 51 comprising a surface acoustic wave device is interposed on a signal line connected to the transmitting signal terminal Tx through the branchpoint 10 while a receiving filter 41 comprising a surface acoustic wave device is interposed on a signal line connected to the receiving signal terminal Rx through the branchpoint 10 (see JP-A-340781/1999).

Furthermore interposed between the branchpoint 10 and the receiving filter 41 is a phase-matching strip line 7 for phase rotation, to match the phases between the transmitting filter 51 and the receiving filter 41 (JP-A-307383/2000). Incidentally the phase-matching strip line 7 is interposed between the branchpoint 10 and the filter having a higher pass band of the transmitting filter 51 and the receiving filter 41.

FIG. 6 shows the construction of the antenna duplexer 80 which is enclosed in a package. A recess portion is formed on a surface of a multilayer ceramic package 82 having ceramic layers 81 superposed. The transmitting filter 51 and the receiving filter 41 are mounted on a bottom surface of the recess portion. A plurality of signal input/output pads 9 and grounding pads 91 are arranged around the filters 41, 51. Further, formed on surfaces of the four lower ceramic layers 81 constituting the package 82 are, in order from bottom layer, a grounding layer 71, the aforementioned phase-matching strip line 7, circuit element pattern 6 which requires a capacitor etc., and grounding layer 61. The phase-matching strip line 7, for example, has a pattern as shown in FIG. 7. Further, formed on side surfaces of the package 82 are, as shown in FIG. 7, a plurality of castellation 84 including an antenna terminal ANT, transmitting signal terminal Tx and receiving signal terminal Rx.

With the antenna duplexer, when a signal is to be transmitted, the signal received by the transmitting signal terminal Tx passes through the transmitting filter 51 and thereafter is fed from the antenna terminal ANT to an antenna. In this case there occurs a phenomenon that the signal received by the transmitting signal terminal Tx sneaks around to the receiving signal terminal Rx, so that there is a need to take sufficient isolation measures against the phenomenon.

Accordingly with the conventional antenna duplexer, various isolation measures are heretofore taken to a signal path from the transmitting signal terminal Tx to the receiving signal terminal Rx via the transmitting filter 51 and the receiving filter 41. However, the conventional antenna duplexer has not yet achieved the sufficient isolation effect, and therefore there is still room for more improvement.

SUMMARY OF THE INVENTION

An object of the present invention is to provide an antenna duplexer for achieving a further higher isolation effect than conventionally.

We have conducted intensive research and found the cause of failing to achieve sufficient isolation effect with the conventional antenna duplexer. Based on the result we have succeeded in developing an antenna duplexer for achieving a further higher isolation effect than conventionally.

With the conventional antenna duplexer, as shown in FIG. 7, a transmitting signal terminal Tx and a receiving signal terminal Rx are disposed at opposite sides of a phase-matching strip line 7 formed on a ceramic layer 81, so that some of the signals received by the transmitting signal terminal Tx directly sneak around to the receiving signal terminal Rx through the phase-matching strip line 7, and are fed from the receiving signal terminal Rx to a receiving circuit.

An antenna duplexer embodying the present invention comprises a package 83 having a plurality of ceramic layers 81 superposed, and a transmitting filter 51 and a receiving filter 41 which are mounted on a surface of the package 83. A phase-matching strip line 7 is formed on a surface of at least one ceramic layer 81 providing the package 83.

Further, grounding layers 61, 71 are formed respectively on surfaces of upper and lower ceramic layers 81, 81 of the package 83 with the aforementioned phase-matching strip line 7 interposed therebetween. A plurality of conductor lines are formed around the phase-matching strip line 7 for connecting the two grounding layers 61, 71 to each other.

With the antenna duplexer embodying the present invention, a plurality of conductor lines are formed around the phase-matching strip line 7, and opposite ends of each of the conductor lines are respectively connected to the upper and the lower grounding layers 61, 71. This provides a shield around the phase-matching strip line 7, blocking a signal sneak path from the transmitting signal terminal Tx to the receiving signal terminal Rx via the phase-matching strip line 7, thus achieving a higher isolation effect.

Stated more specifically, the plurality of conductor lines comprise via holes 4 each provided by forming conductor film on an inner peripheral surface of a hole vertically extending through the ceramic layers 81 between the two grounding layers 61, 71, or by filling the hole with conductor. Further, formed on side surfaces of the package 83 are a plurality of castellations 84 including an antenna terminal ANT, transmitting signal terminal Tx and receiving signal terminal Rx. The conductor lines are interposed between the transmitting signal terminal Tx and the phase-matching strip line 7, and/or between the receiving signal terminal Rx and the phase-matching strip line 7.

According to the specific construction, a shield is provided between the transmitting signal terminal Tx and the phase-matching strip line 7, or a shield is provided between the receiving signal terminal Rx and the phase-matching strip line 7, thus blocking a signal transmission path from the transmitting signal terminal Tx to the receiving signal terminal Rx via the phase-matching strip line 7, improving the isolation characteristics.

Stated more specifically, the plurality of conductor lines are arranged so as to surround entirely an area in which the phase-matching strip line 7 is formed. This provides the shield all around the phase-matching strip line 7, whereby unnecessary signals from the outside can be interrupted.

As described above, the antenna duplexer of the present invention can achieve a higher isolation effect than conventionally.

DETAILED DESCRIPTION OF THE INVENTION

Figure 2:
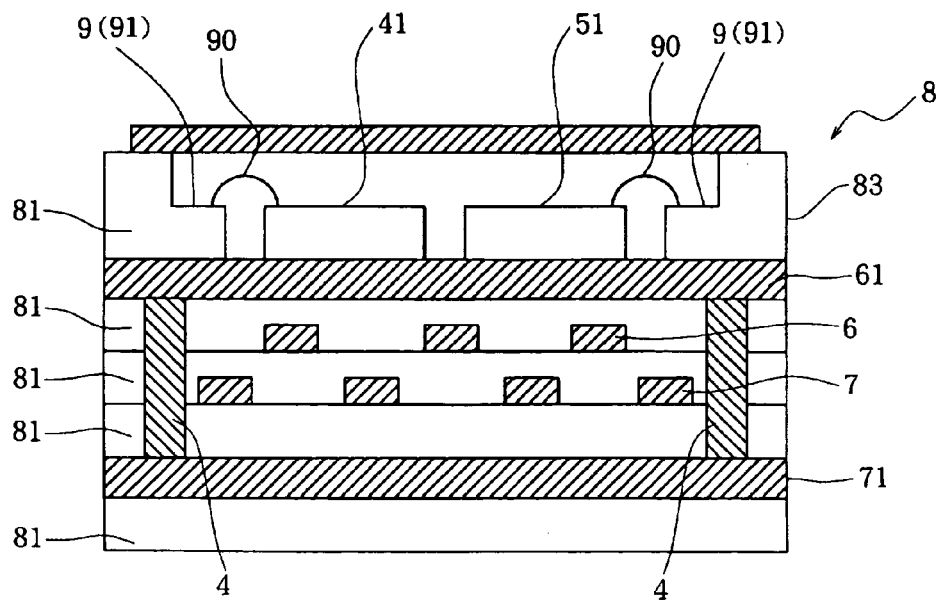
FIG. 2 is a view in section of the antenna duplexer.

An embodiment of the present invention will be described below with reference to the drawings. An antenna duplexer embodying the present invention, as shown in FIG. 2, includes a rectangular parallelepipedal package 83 having a plurality of ceramic layers 81 superposed. A recess portion is formed on a surface of the uppermost ceramic layer 81. A transmitting filter 51 and a receiving filter 41 are mounted on a bottom surface of the recess portion. Further, formed on surfaces of the four lower ceramic layers 81 constituting the package 83 are, in order from bottom layer, a grounding layer 71, phase-matching strip line 7, circuit element pattern 6 which requires a capacitor etc., and grounding layer 61.

Figure 3:
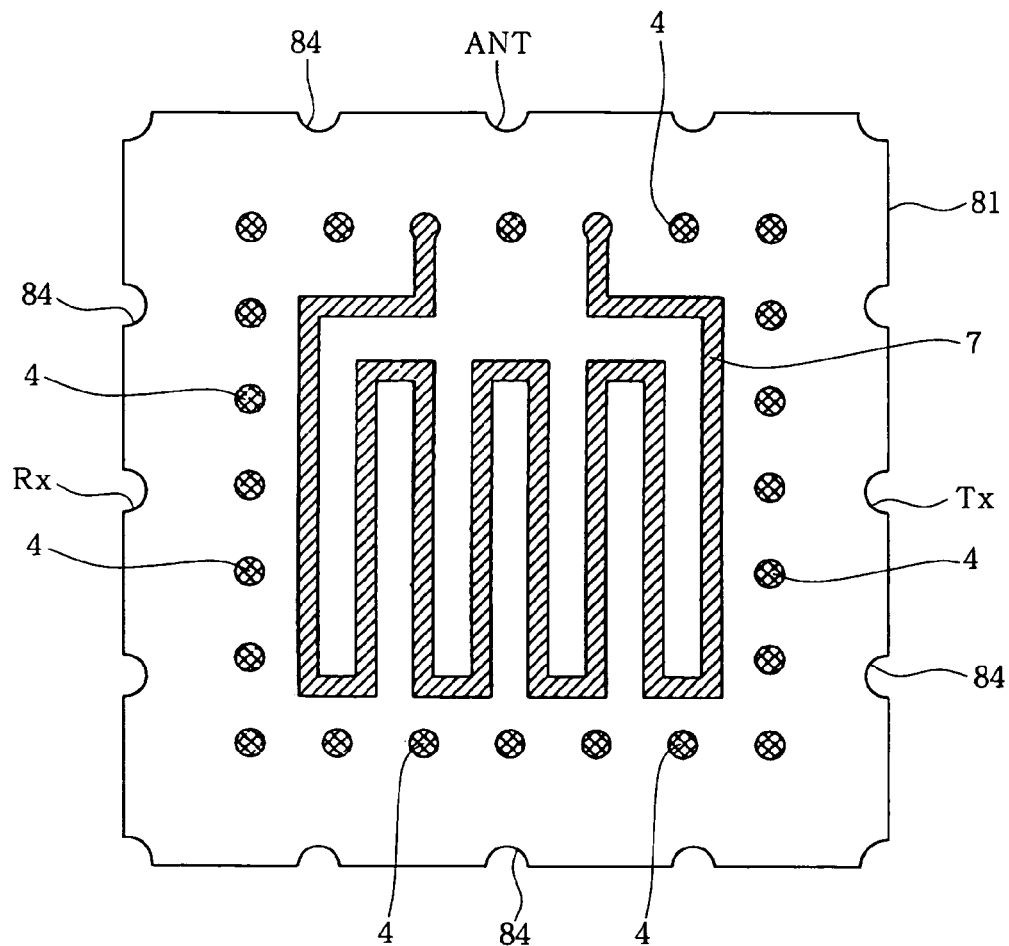
FIG. 3 is a plan view of a ceramic layer on which a phase-matching strip line is formed.

As shown in FIGS. 2 and 3, formed on the package 83 repeatedly with a predetermined pitch are a plurality of via holes 4 surrounding the phase-matching strip line 7 to connect the upper and the lower grounding layers 61, 71 to each other. For example, when the package is 5 mm×5 mm in size, the diameter of the via hole 4 ranges from 0.1 mm to 0.2 mm, and the pitch is approximately 0.5 mm. Incidentally the via hole 4 can be provided by subjecting to conductor plating an inner peripheral surface of a hole extending vertically through the ceramic layers 81 between the two grounding layers 61, 71 or by filling the hole with conductor.

Figure 1:
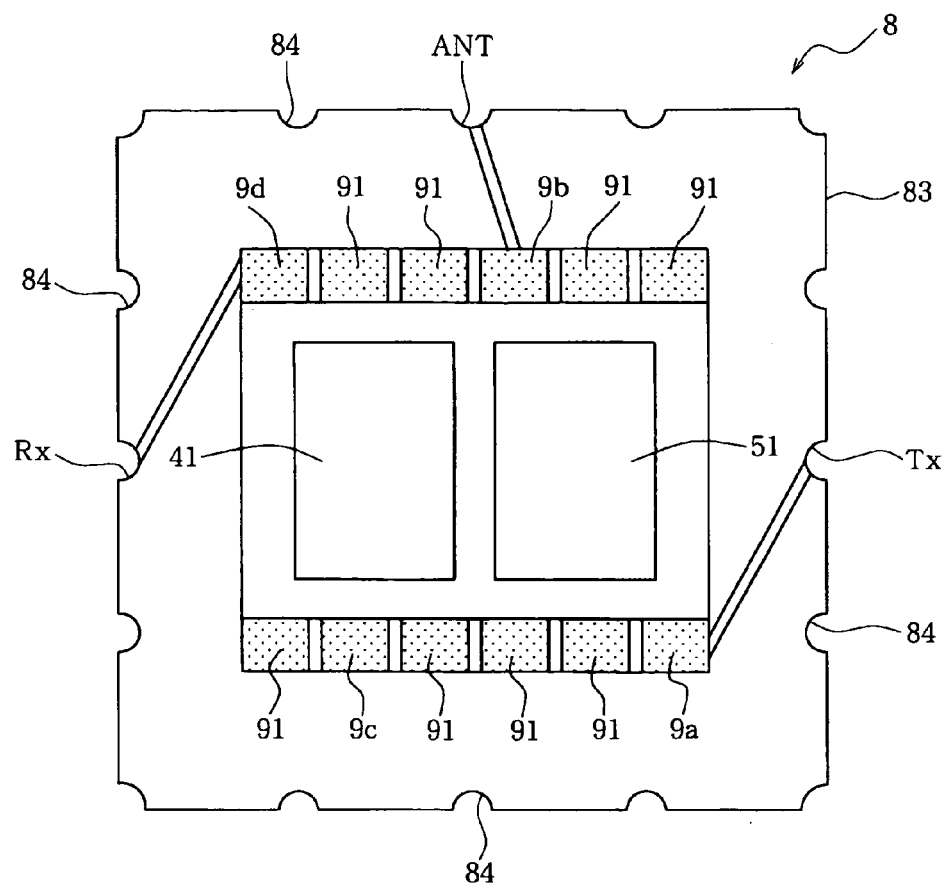
FIG. 1 is a plan view of an antenna duplexer embodying the present invention.

As shown in FIG. 1, the package 83 has a surface provided thereon with, at opposite sides of the transmitting filter 51 and the receiving filter 41, a transmitting signal input pad 9a, transmitting signal output pad 9b, receiving signal input pad 9c, receiving signal output pad 9d, and a plurality of grounding pads 91. The pads are arranged into two rows along two vertical walls of the recess portion and parallel to each other. As shown in FIG. 2, the aforementioned pads 9, 91 are connected to the transmitting filter 51 and the receiving filter 41 by bonding wires 90.

As shown in FIG. 1, formed on four side surfaces of the package 83 are a plurality of castellations 84 including an antenna terminal ANT, transmitting signal terminal Tx and receiving signal terminal Rx. The transmitting signal input pad 9a is connected to the transmitting signal terminal Tx, the receiving signal output pad 9d is connected to the receiving signal terminal Rx, and the transmitting signal output pad 9b is connected to the antenna terminal ANT.

Figures 4A, 4B:
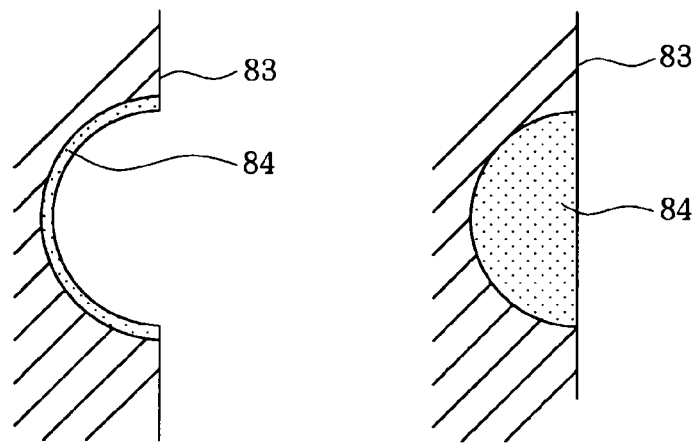
FIG. 4(a) and FIG. 4(b) each is an enlarged view in section showing the construction of a castellation.
Figure 5:
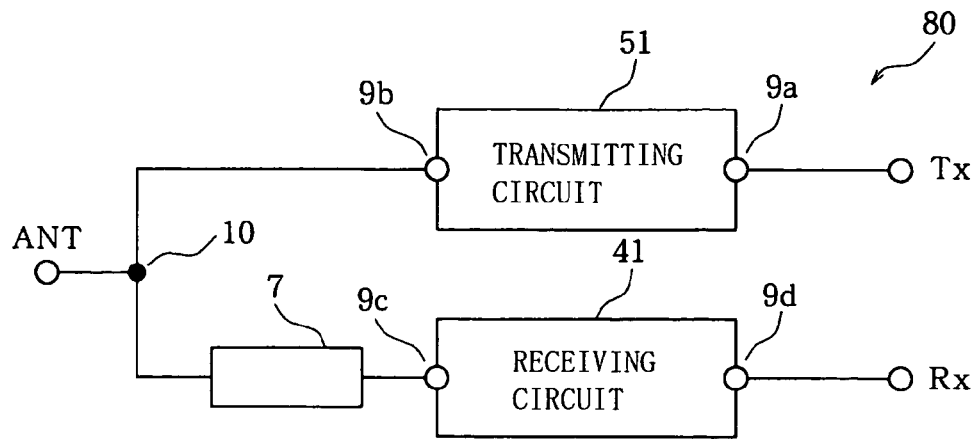
FIG. 5 is a block diagram showing the electrical construction of the antenna duplexer.

The castellation 84 can be formed, as shown in FIG. 4(a), not only by subjecting to conductor plating an inner peripheral surface of a recess portion formed on the side surface of the package 83 and having a semicircle section, but by filling with conductor the recess portion having a semicircle section, as shown in FIG. 4(b).

Figure 6:
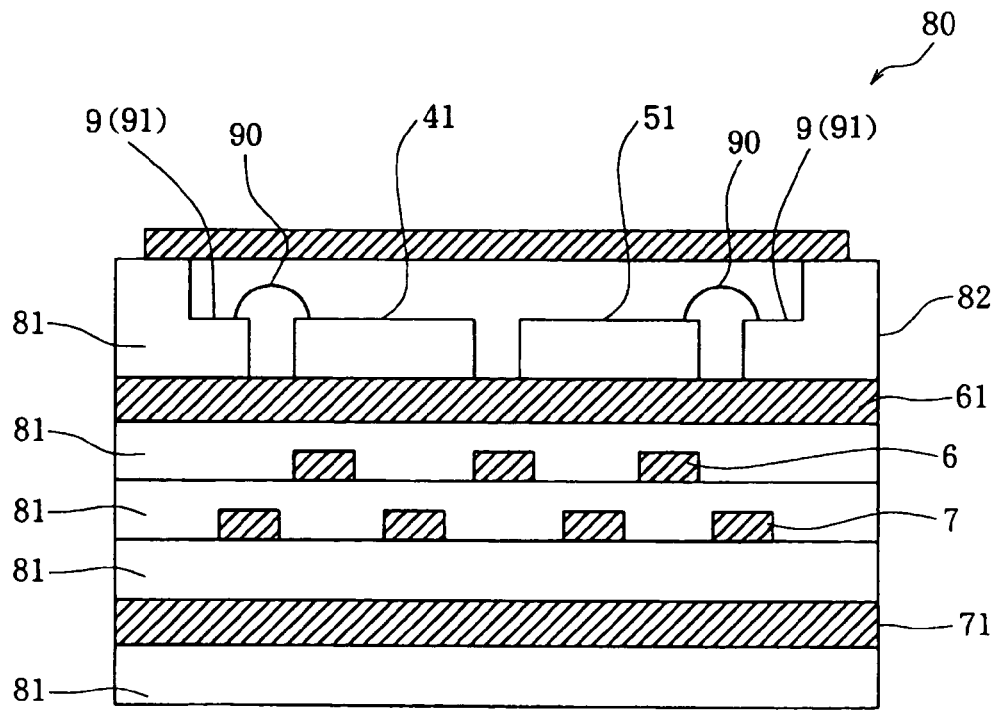
FIG. 6 is a view in section of the conventional antenna duplexer.
Figure 7:
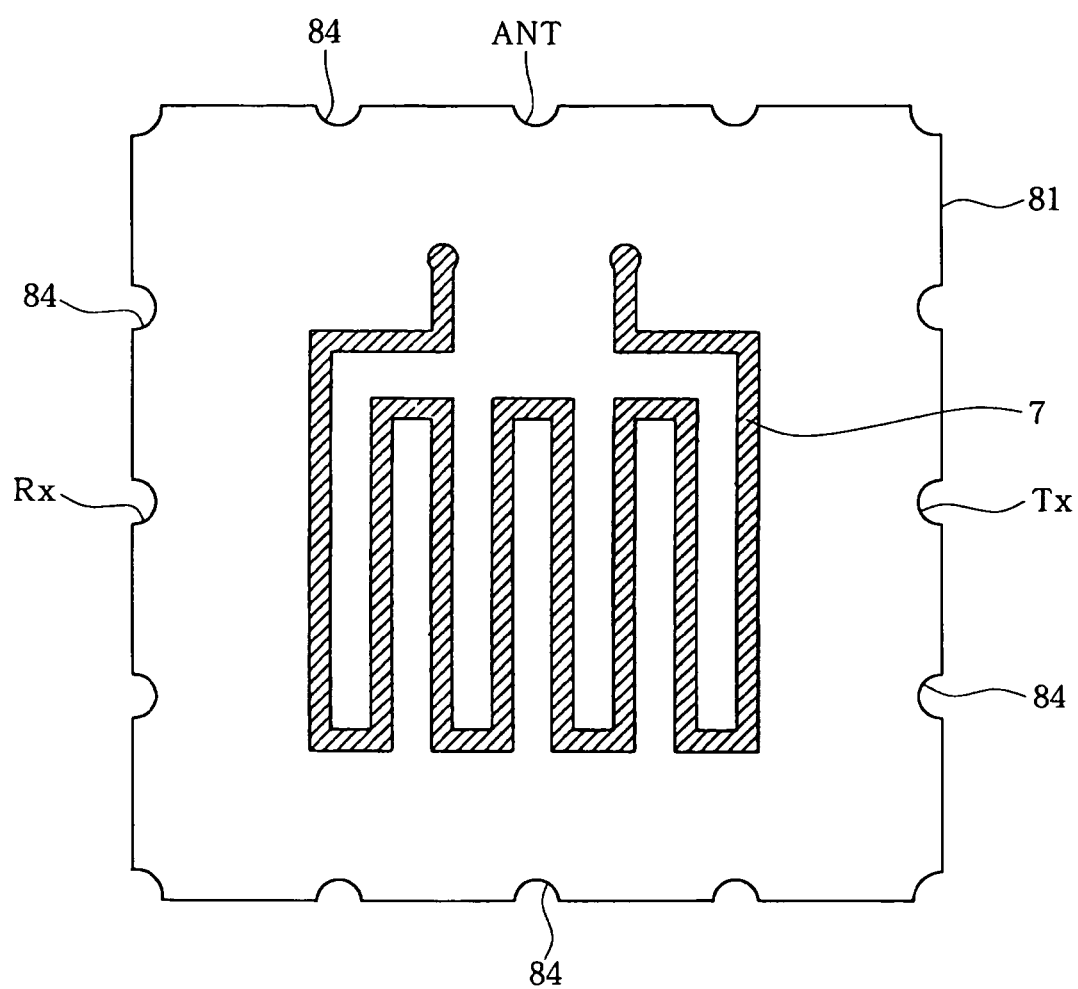
FIG. 7 is a plan view of a ceramic layer on which a phase-matching strip line is formed with the antenna duplexer.
Figure 8:
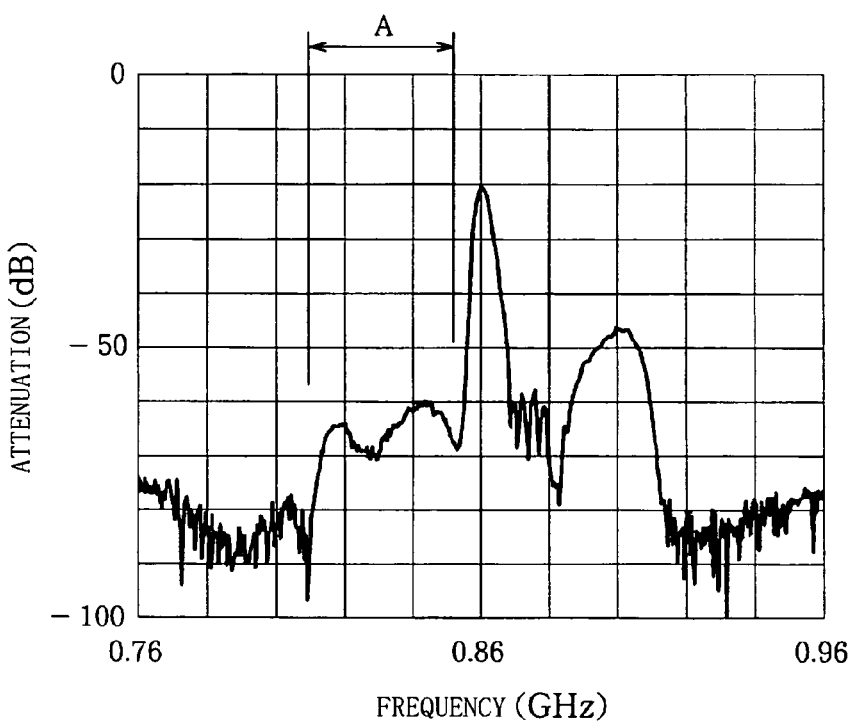
FIG. 8 is a graph showing isolation characteristics of the antenna duplexer of the present invention.
Figure 9:
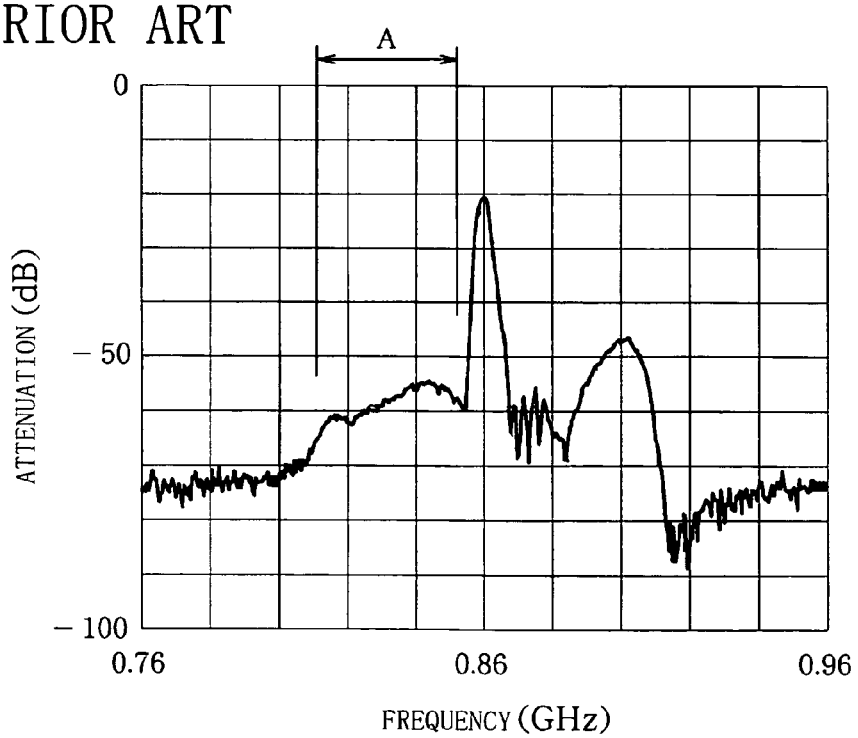
FIG. 9 is a graph showing isolation characteristics of the conventional antenna duplexer.

FIG. 8 shows the isolation characteristics of the signal received by the transmitting signal terminal Tx to sneak around to the receiving signal terminal Rx, with the antenna duplexer 8 shown in FIG. 2 of the present invention. FIG. 9 shows the similar isolation characteristics with the conventional antenna duplexer 80 shown in FIG. 6. Particularly, within the pass band A in the figures, the isolation characteristics of the antenna duplexer of the present invention shown in FIG. 8 is approximately 5 dB greater in attenuation than the isolation characteristics of the conventional antenna duplexer shown in FIG. 9. This clarifies the improvement of the isolation characteristics.

As discussed above, with the antenna duplexer 8 of the present invention, the plurality of via holes 4 are arranged so as to surround the phase-matching strip line 7, whereby the higher isolation effect can be achieved. Furthermore, the upper and the lower grounding layers 61, 71 are connected to each other by the castellations 84 and by the plurality of via holes 4, to thereby strengthen the grounding.

The device of the invention is not limited to the foregoing embodiment in construction but can be modified variously by one skilled in the art without departing from the spirit of the invention as set forth in the appended claims. For example, the via holes 4 are not limitedly arranged so as to surround entirely the phase-matching strip line 7, as shown in FIG. 3, but the via holes 4 can be arranged in a part of the area between the transmitting signal terminal Tx and the phase-matching strip line 7 and/or only in a part of the area between the receiving signal terminal Rx and the phase-matching strip line 7.

What is claimed is:

1. An antenna duplexer comprising a package (83) having a plurality of ceramic layers (81) superposed, and a transmitting filter (51) and a receiving filter (41) which are mounted on a surface of the package (83), a phase-matching strip line (7) being formed on a surface of at least one ceramic layer (81) providing the package (83), grounding layers (61), (71) being formed respectively on surfaces of upper and lower ceramic layers (81), (81) of the package (83) with the phase-matching strip line (7) interposed therebetween, a plurality of conductor lines being formed around the phase-matching strip line (7) for connecting the two grounding layers (61), (71) to each other, the plurality of conductor lines being electrically separated from each other on the surface of the ceramic layer (81) formed with the phase-matching strip line (7).

2. An antenna duplexer according to claim 1, wherein the plurality of conductor lines comprise via holes (4) each provided by forming conductor film on an inner peripheral surface of a hole vertically extending through the ceramic layers (81) between the two grounding layers (61), (71), or by filling the hole with conductor.

3. An antenna duplexer according to claim 2, wherein a plurality of castellations (84) including an antenna terminal ANT, transmitting signal terminal Tx and receiving signal terminal Rx are disposed on side surfaces of the package (83), the conductor lines being arranged in an area between the transmitting signal terminal Tx and the phase-matching strip line (7), and/or in an area between the receiving signal terminal Rx and the phase-matching strip line (7).

4. An antenna duplexer according to claim 1, wherein the plurality of conductor lines are arranged so as to surround entirely an area in which the phase-matching strip line (7) is formed.

* * * * *